United States Patent [19]

Yamakawa et al.

[11] Patent Number: 5,170,136
[45] Date of Patent: Dec. 8, 1992

[54] DIGITAL TEMPERATURE COMPENSATION OSCILLATOR

[75] Inventors: Tsutomu Yamakawa; Kuichi Kubo; Hiroshi Yoshida, all of Tokyo, Japan

[73] Assignee: Nihon Dempa Kogyo Co., Ltd., Tokyo, Japan

[21] Appl. No.: 754,586

[22] Filed: Sep. 4, 1991

[30] Foreign Application Priority Data

Sep. 14, 1990 [JP] Japan .................................. 2-245764

[51] Int. Cl.$^5$ ........................ H03B 5/04; H03B 5/32; H03L 1/02
[52] U.S. Cl. ..................................... 331/176; 331/158
[58] Field of Search ..................... 331/66, 116 R, 158, 331/176

[56] References Cited

U.S. PATENT DOCUMENTS 4,922,212  5/1990  Roberts et al. ...................... 331/176

OTHER PUBLICATIONS

"Numerical Mathematics" by Gunther Hammerlin et al 1991 Springer-Verlag New York, Inc.
36th Annual Frequency Control Symposium-1982; "Methods of Temperature Compensation" by M. E. Frerking; pp. 564–570.

*Primary Examiner*—David Mis
*Attorney, Agent, or Firm*—Frishauf, Holtz, Goodman & Woodward

[57] ABSTRACT

A digital temperture compensation oscillator for digitally compensating a variation in oscillation frequency due to temperatures, by applying a compensation voltage to a voltage controlled oscillator, comprises temperature detection means, A/D conversion means, memory means, operation means and D/A conversion means. The temperature detection means detects temperatures when the voltage controlled oscillator is operated, and generates a temperature signal. The A/D conversion means receives the temperature signal, digitizes the temperature signal, and generates digital temperature data. The memory means stores compensation data corresponding to the compensation voltage as difference data at corresponding addresses. The difference data includes, when N-stage level difference data (N=a positive integer) are utilized, predetermined reference values of 0th difference data to (N−1)-th difference data of the compensation data and all N-th difference data. The operation means receives the digital temperature data and the difference data, and generates the compensation data on the basis of the difference data in response to the digital temperature data. The D/A conversion means receives the compensation data, converts the compensation data into an analog compensation voltage, and supplies the analog compensation voltage to the voltage controlled oscillator.

6 Claims, 8 Drawing Sheets

| 0TH DIFFERENCE | FIRST DIFFERENCE | SECOND DIFFERENCE |
|---|---|---|
| $A_0$ | | |
| $A_1$ | $B_1 = A_1 - A_0$ | |
| $A_2$ | $B_2 = A_2 - A_1$ | $C_2 = B_2 - B_1$ |
| $A_3$ | $B_3 = A_3 - A_2$ | $C_3 = B_3 - B_2$ |
| ⋮ | ⋮ | ⋮ |
| $A_i$ | $B_i = A_i - A_{i-1}$ | $C_i = B_i - B_{i-1}$ |
| ⋮ | ⋮ | ⋮ |
| $A_{n-1}$ | $B_{n-1} = A_{n-1} - A_{n-2}$ | $C_{n-1} = B_{n-1} - B_{n-2}$ |
| $A_n$ | $B_n = A_n - A_{n-1}$ | $C_n = B_n - B_{n-1}$ |

FIG. 4

| ADDRESS | 0TH DIFFERENCE | FIRST DIFFERENCE | SECOND DIFFERENCE |
|---|---|---|---|
| 0 | 9662 | | |
| 1 | 9764 | 102 | |
| 2 | 9855 | 91 | -11 |
| 3 | 9933 | 78 | -13 |
| 4 | 9996 | 63 | -15 |
| 5 | 10046 | 50 | -13 |
| 6 | 10083 | 37 | -13 |
| 7 | 10106 | 23 | -14 |
| 8 | 10119 | 13 | -10 |
| 9 | 10118 | -1 | -14 |
| 10 | 10107 | -11 | -10 |
| 11 | 10086 | -21 | -10 |
| 12 | 10055 | -31 | -10 |
| 13 | 10014 | -41 | -10 |
| 14 | 9965 | -49 | -8 |
| 15 | 9907 | -58 | -9 |
| ⋮ | ⋮ | ⋮ | ⋮ |
| 95 | 3027 | 108 | 12 |
| 96 | 3147 | 120 | 12 |
| 97 | 3277 | 130 | 10 |
| 98 | 3419 | 142 | 12 |
| 99 | 3576 | 157 | 15 |
| 100 | 3741 | 165 | 8 |

FIG. 8 ent given below, serve to explain the principles of the invention.

DIGITAL TEMPERATURE COMPENSATION OSCILLATOR

BACKGROUND OF THE INVENTION

1. Field of the Invention

In consideration of problems relating to communications, a high-stability oscillator has recently been employed in wireless devices, etc. A typical example of such oscillators is a digital temperature compensation oscillator capable of digitally compensating a variation in oscillation frequency due to temperatures. FIG. 1 is a block diagram illustrating an example of the digital temperature compensation oscillator.

2. Description of the Related Art

The temperature compensation oscillator comprises a temperature detection portion 11, an A/D conversion portion 12, a stored-data read-out portion 13, a D/A conversion portion 14 and a voltage controlled oscillator 15. An analog output from the temperature detection portion 11 is digitized by the A/D conversion portion 12 into temperature data, and the temperature data is supplied to the stored-data read-out portion 13. Compensation data corresponding to the temperature data is read out from the read-out portion 13. The read-out compensation data is converted by the D/A conversion portion 14 into analog data of compensation voltage. The compensation voltage is applied to a voltage variable capacity element (not shown) of the voltage-controlled oscillator 15. Thus, temperature-compensated oscillation frequency is obtained.

In the digital temperature compensation oscillator having the above structure, however, compensation voltages corresponding to all frequency variation components at respective temperatures are A/D converted and the resultant compensation data are directly stored in a storage portion. Consequently, an expensive large-capacity storage portion must be employed in order to high stability of frequency.

In addition, in the prior art, when a small-capacity storage portion is used, frequency/temperature characteristic is approximated in a sawtooth shape as shown in FIG. 2 and stored in the storage portion. Accordingly, the oscillation frequency/temperature characteristic varies non-continuously in a digital manner. As a result, resolution decreases and high-stability oscillation frequency cannot be obtained.

Furthermore, in the prior art, when a temperature corresponding to an intermediate address between a certain address and its adjacent address in a storage portion is detected, one of the certain address and the adjacent address is normally selected. Thus, the storage capacity determines the limit of frequency stability. Consequently, digital-wise discontinuity in frequency/ambient temperature characteristic becomes more conspicuous, and high-stability oscillation frequency cannot be obtained.

SUMMARY OF THE INVENTION

The object of the present invention is to provide a digital temperature compensation oscillator capable of enhancing stability in frequency characteristic with respect to temperatures, and capable of employing a memory portion with a less capacity.

In this invention, compensation data necessary for obtaining a predetermined oscillation frequency is stored in a difference data format, and not in its original format. Specifically, when N is an integer, the compensation data is converted in difference data format with N-stage difference levels. Initial values of 0th difference data to (N-1)th difference data and all values of Nth difference data of the difference data are stored. In operation, predetermined arithmetic operations are carried out on the basis of temperature data and difference data stored in the memory portion, thereby obtaining compensation data.

If an address corresponding to the temperature data has an intermediate value between adjacent addresses in the memory portion, interpolation is carried out by approximation based on an Nth or lower polynomial expression, by use of the difference data, thereby generating optimal compensation data at the ambient temperature.

In this invention, since the compensation data is stored in the difference data format, the memory capacity required in the memory portion can be reduced. Thus, when a memory portion of a predetermined capacity is employed, many compensation data can be stored, and an oscillator with high frequency stability can be obtained.

Since the interpolation based on approximation using the Nth or lower polynomial expression can be easily carried out on the basis of the N-levels of difference data, the frequency stability is further enhanced. The present invention can provide a novel high-precision digital temperature compensation oscillator and the value of the oscillator in industrial use is very high.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 4 shows examples of temperature compensation data of difference format and data stored in a storage portion in the present invention;

FIG. 8 shows specific examples of temperature compensation data (0th difference data, first difference data, second difference data) in a digital temperature compensation oscillator of this invention;

DETAILED DESCRIPTION OF THE PREFERRED EMBODIMENTS

Figure 5:
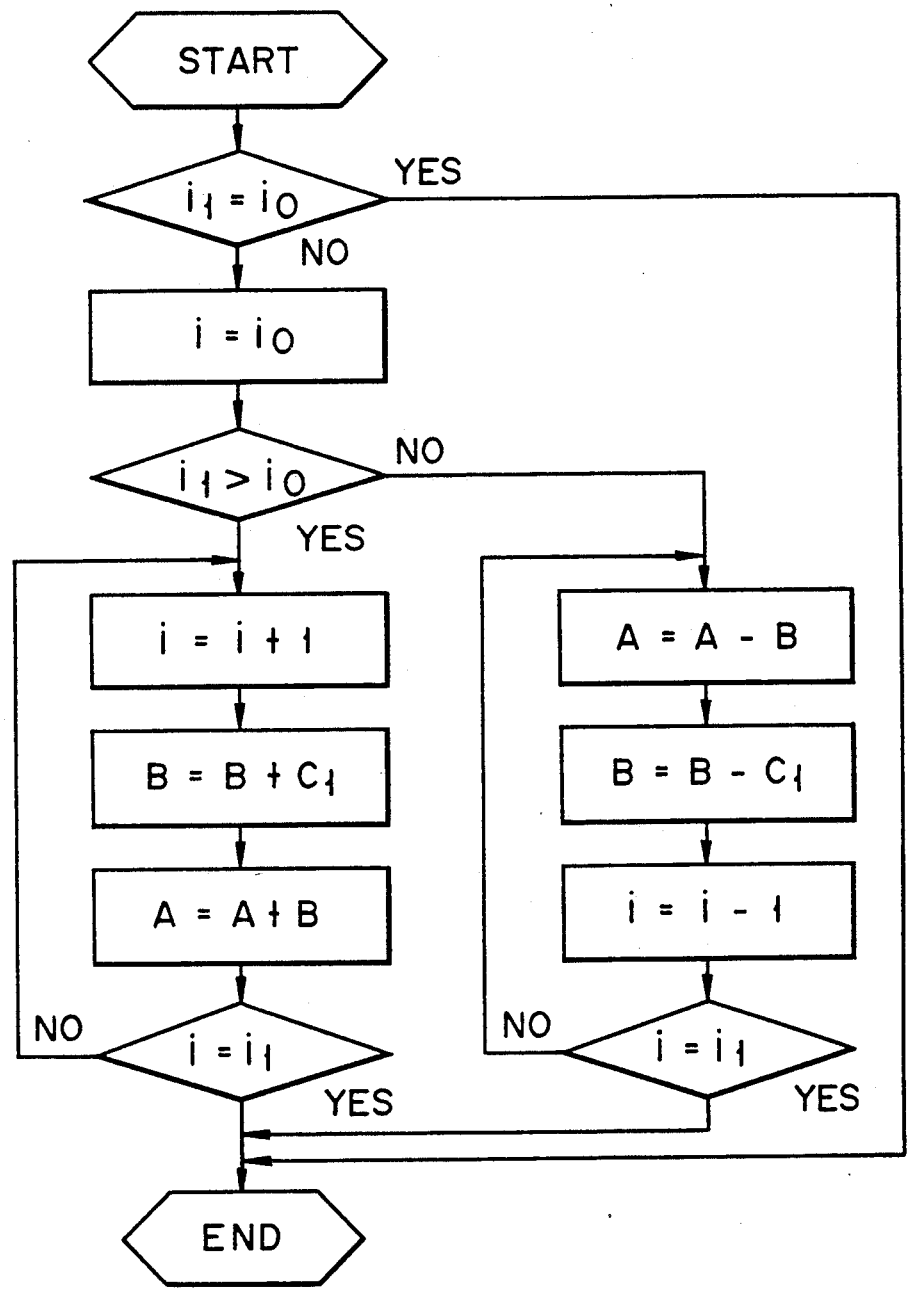
FIG. 5 is a flowchart illustrating a process of generating temperature compensation data according to the present invention.

An embodiment of the present invention will now be described with reference to accompanying FIGS. 3, 4 and 5.

Figure 3:
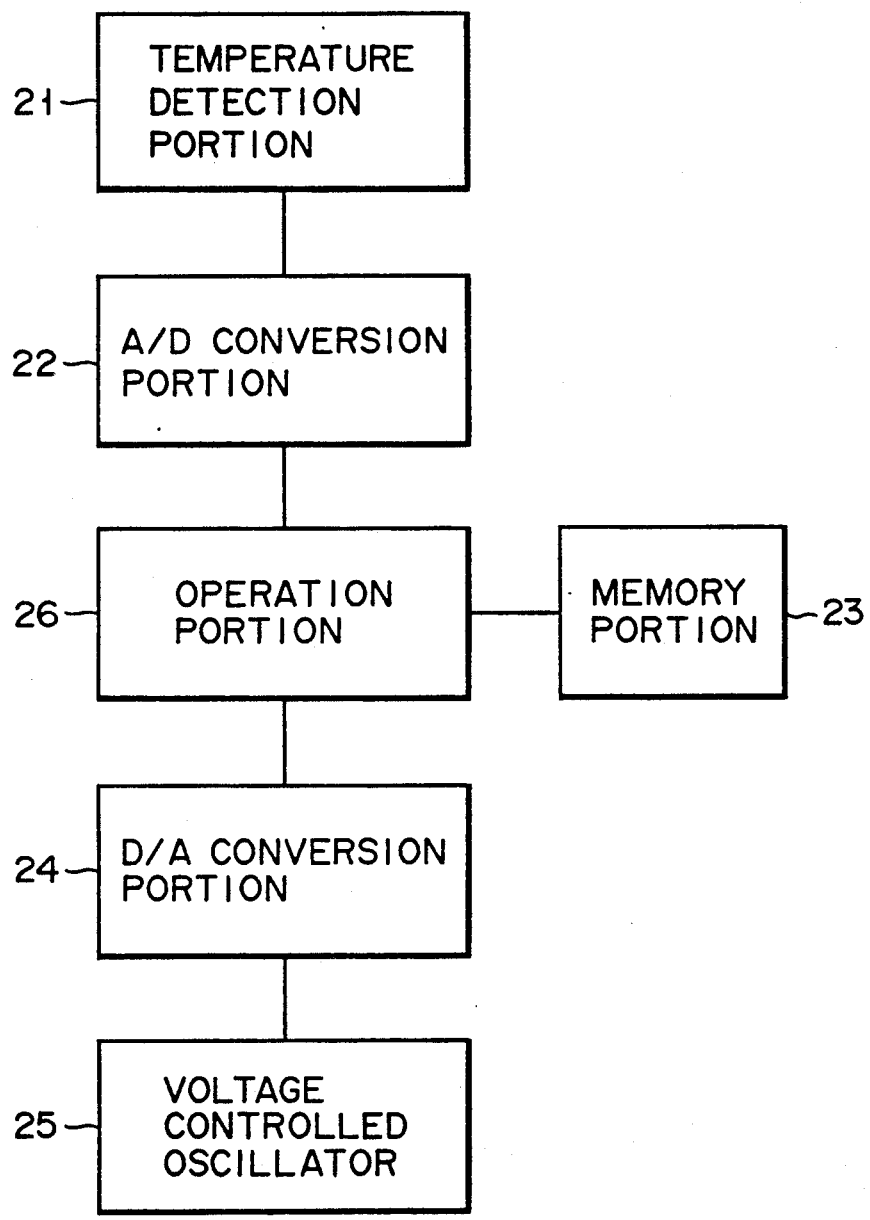
FIG. 3 is a block diagram showing a digital temperature compensation oscillator according to an embodiment of the present invention.

As is shown in FIG. 3, the digital temperature compensation oscillator comprises a temperature detection portion 21, an A/D conversion portion 22, an operation portion 26, a memory portion 23, a D/A conversion portion 24 and a voltage controlled oscillator 25.

The temperature detection portion 21 is an analog circuit for detecting an ambient temperature and generating temperature data by utilizing, for example, a forward voltage of a diode or a temperature dependency of a resistance value of a thermistor. The A/D converter 22 digitizes the temperature data from the temperature detection portion 21 and generates digital temperature data. The digital temperature data is formed so as to correspond to addresses 0, 1, ..., n in the memory portion 23 (described below). In the memory portion 23, compensation data $A_0, A_1, \ldots, A_n$ corresponding to compensation voltages at respective temperatures are converted to difference data (described below) and the difference data are stored in advance in the addresses 0, 1, ..., n. The operation portion 26 reads out necessary difference data from the memory portion 23 in accordance with temperature data and generates compensation data $A_0, A_1, \ldots, A_n$ on the basis of the difference data. The D/A conversion portion 24 converts the compensation data $A_0, A_1, \ldots A_n$ generated by the operation portion 26 to analog voltages (compensation voltages). The analog voltages are applied to a voltage variable capacity element of the voltage controlled oscillator 25.

As is shown in FIG. 4, the difference data are based on compensation data $A_0, A_1, \ldots A_n$ and are formed, for example, as second difference data wherein N=2. Specifically, compensation data $A_0, A_1, \ldots A_n$ are 0th difference data, and differences between the 0th difference data $A_0, A_1, \ldots A_n$ are first difference data $B_1, B_2, \ldots B_n$. Differences between the first difference data $B_1, B_2, \ldots B_n$ are second difference data $C_2, C_3, \ldots, C_n$. Of these difference data, the top 0th difference data $A_0$, top first difference data $B_1$ and all second difference data $C_2, C_3, \ldots C_n$ (all underlined in FIG. 4) are stored in the memory portion 23 at addresses 0, 1, ..., n.

Accordingly, the original compensation data (0th difference data) $A_0, A_1, \ldots A_n$ are obtained, inversely to the conversion to the difference-format data, by calculating the first difference data $B_1, B_2, \ldots B_n$ from the second difference data $C_2, C_3, \ldots C_n$, and calculating the 0th difference data $A_0, A_1, \ldots A_n$ from the first difference data $B_1, B_2, \ldots B_n$. In other words, when the temperature varies in such a direction that the address of the memory portion 23 increases, the original compensation data $A_0, A_1, \ldots A_n$ are obtained by the following equations (1) and (2):

$$B_i = C_i + B_{i-1} \tag{1}$$

$$A_i = B_i + A_{i-1} \tag{2}$$

Inversely, when the temperature varies in such a direction that the address of the memory portion 23 decreases, the original compensation data $A_0, A_1, \ldots A_n$ are obtained by the following equations (3) and (4):

$$B_{i-1} = B_i - C_i \tag{3}$$

$$A_{i-1} = A_i - B_i \tag{4}$$

The function of the operation portion 26 of the temperature compensation oscillator having the compensation data of the above difference format will now be described with reference to the flowchart of FIG. 5. The initial values are: $i_0 = 0$, $A = A_0$, and $B = B_0 = A_0$. Further, $C_0 = A_0$, and $C_1 = B_1 = A_1 - A_0$. In this case, $i_0$ indicates an address in the previous cycle, $i_1$ indicates an address corresponding to the present temperature, and i indicates an address in an integration operation. Symbol A indicates 0th difference data, B first difference data, and C second difference data.

In the temperature compensation oscillator, at first, in response to the progress of clock pulses, the A/D conversion portion 22 converts the output from the temperature detection portion to temperature data, and selects address $i_1$ in the memory portion 23. Subsequently, the operation portion 23 compares address $i_0$ of the previous cycle with the present address $i_1$ based on the temperature data. When $i_1 = i_0$, that is, the temperature is constant, the compensation data $A_{i-1}$ of the previous cycle is output as it is.

When $i_1 > i_0$, that is, the temperature rises, 1 is first added to $i(i_0)$. Based on the second difference data $C_{i0+1}$ at the time of $i = i_0 + 1$, the first difference data $B_{i0+1}$ and 0th difference data $A_{i0+1}$ are obtained according to the above equation (1). This calculation is repeated until i becomes $i_1$.

On the other hand, $i_1 < i_0$, that is, the temperature falls, based on the 0th difference data $A_{i0}$ at the time of $i_0$, the first difference data $B_{i0-1}$ and 0th difference data $A_{i0-1}$ are obtained according to the above equations (3) and (4), and 1 is subtracted from $i(i_0)$. In a manner similar to the above, this operation is repeated until i becomes $i_1$.

In this way, the obtained 0th difference data (compensation data) is converted to a compensation voltage by the D/A conversion portion 24.

In the specific example of the present invention, the compensation data $A_0, A_1, \ldots A_n$ are stored in the two difference stage format consisting of the top 0th difference data $A_0$, top first difference data $B_1$ and all second difference data $C_2, C_3, \ldots C_n$. Thereby, the operation portion 26, by the above function, can generate the compensation data $A_0, A_1, \ldots A_n$ in response to the temperature data.

In general, the differences between the respective compensation data $A_0, A_1, \ldots A_n$ are small, the absolute values of the difference data becomes much smaller than the absolute value of the compensation data as the stage or order of differences increases. Thus, the capacity of the memory portion 23 can be remarkably decreased.

Next, an Nth-order interpolation method according to the present invention will be described. A secondary interpolation on the basis of N=2 is described by way of example.

In an example of a simple secondary interpolation, a secondary formula covering three points, i.e. a point to be interpolated and adjacent two points, is obtained to effect the secondary interpolation. According to this method, the following equation (5) can be obtained as a secondary interpolation formula in the above example:

$$A_x = A_i + \{(B_i + B_{i+1})/2\} \cdot X + (C_{i+1}/2) \cdot X^2 \quad (5)$$

Symbols in equation (5) are those appearing in FIG. 4. Symbols i and i+1 are integers indicating addresses in the memory portion. Symbol X corresponds to an intermediate address to be interpolated, and represents a displacement from address i. More specifically, X generally includes values lower than the decimal point.

As is shown in FIG. 4, in equation (5), the data of $A_i$, $B_i$ and $B_{i+1}$ are not stored in the memory portion in advance. Thus, if interpolation calculation is carried out according to equation (5), it is necessary to store three interpolation data of $A_i$, $B_i$ and $B_{i+1}$ in a temporary memory element such as a RAM.

Equation (5) is transformed to obtain the following equation (6):

$$A_x = A_{i+1} + B_{i+1} \cdot X + C_{i+1} \cdot X \cdot (X+1)/2 \quad (6)$$

According to this formula, only two data of $A_{i+1}$ and $B_{i+1}$ need to be stored temporarily, and the memory capacity of the temporary memory element can be decreased. The data $A_{i+1}$ and $B_{i+1}$ required in equation (6) can be obtained by the flowchart of FIG. 5 illustrating the routine of generating compensation data. Since the data of $C_{i+1}$ is stored in the memory portion 23 in advance, it can be obtained simply by a read-out operation.

As stated above, according to the temperature compensation oscillator of this invention wherein compensation data is stored in the difference data format, the difference data can be utilized in the interpolation process. In addition, the interpolation calculation can be simplified, and the capacity of the temporary memory element can be reduced. In a general case where compensation data have some continuity, the interpolation of a suitable order, from 1st order to Nth order, can be carried out to effect temperature compensation with higher precision.

An actual embodiment of a temperature compensation oscillator according to the present invention wherein compensation data are formed in a second difference stage format will now be described.

Figure 6:
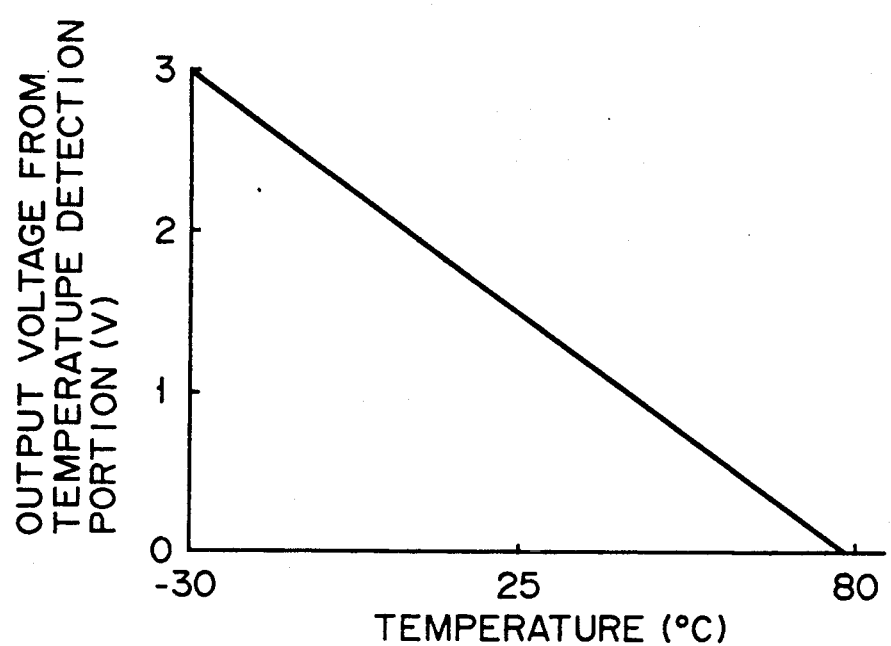
FIG. 6 shows schematically the relationship between output voltage from a temperature detection portion and ambient temperatures.
Figure 7:
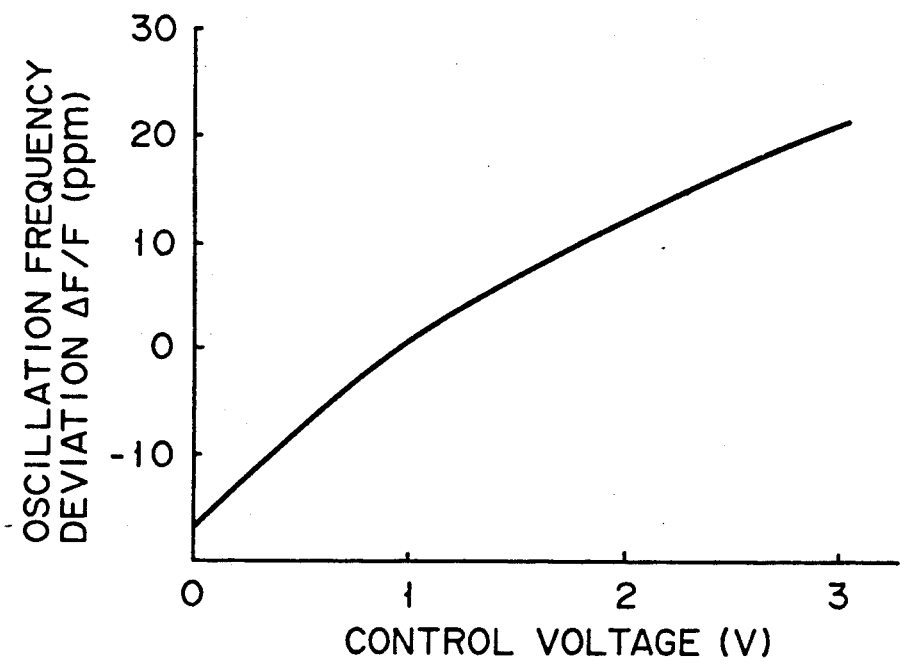
FIG. 7 shows schematically the relationship between oscillation frequency and control voltage in a voltage controlled crystal oscillator.

A diode having a characteristic shown in FIG. 6 is used as temperature detection portion 21. The A/D conversion portion 22 employed in this embodiment has a resolution of 16 bit, and the D/A conversion portion 24 has a resolution of 14 bit. An 8-bit microcomputer is used as operation portion 26. The capacity of the memory portion 23 for compensation data is 105 bytes; two bytes are assigned to each of the top values of 0th difference data and first difference data, and one byte is assigned to each second difference data. A crystal oscillator having a fundamental wave of 12.8 MHz (nominal frequency) is used as voltage controlled oscillator 25 which is subjected to temperature compensation. The oscillation frequency of the voltage controlled oscillator 25 varies in relation to control voltage, as represented by a gentle linear characteristic line shown in FIG. 7. Based on this characteristic line, compensation voltages at temperatures between −25° C. to 75° C. are obtained, and 101 compensation data corresponding to the compensation voltages are obtained.

FIG. 8 shows actual compensation data at respective difference levels in relation to addresses, and shows specifically 0th difference data (original compensation data), first difference data and second difference data. As described above, the data to be stored are the top values of 0th difference data and first difference data and all second difference data. Although the 0th difference data are represented in 14 bits (0 to 16383), the second difference data are represented in 5 bits (−16 to +15). Compared to the prior-art technique of storing directly compensation data, it is well understood that the memory capacity is reduced.

In the actual embodiment, a memory area of 8 bits (−128 to +127) is assigned to one second difference data; thus, actually, the second difference data shown in FIG. 8 are multiplied by a factor.

Figure 9:
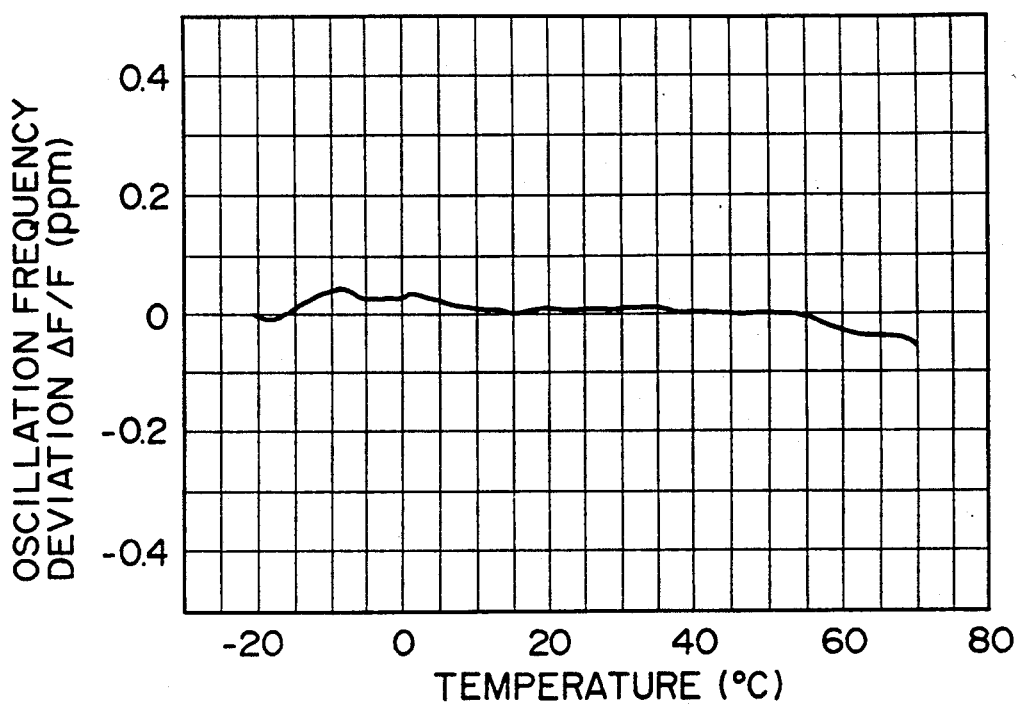
FIG. 9 is a graph showing the relationship between oscillation frequency and ambient temperatures in the digital temperature compensation oscillator of this invention.

FIG. 9 is a graph showing the relationship between oscillation frequency and ambient temperatures in the thus constituted digital temperature compensation oscillator. The oscillation frequencies were measured over the ambient temperature range of −20° C. to +70° C. at intervals of 0.1° C. As is obvious from the graph, the frequency characteristic is flat. The frequency stability to temperatures was ±0.05 ppm or less.

Figure 1:
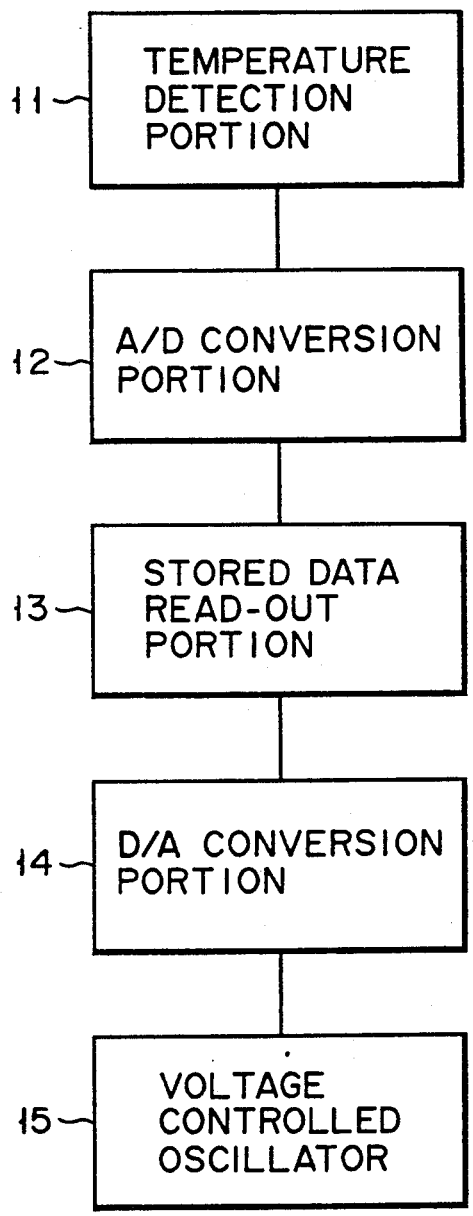
FIG. 1 is a block diagram showing an example of a conventional digital temperature compensation oscillator.
Figure 2:
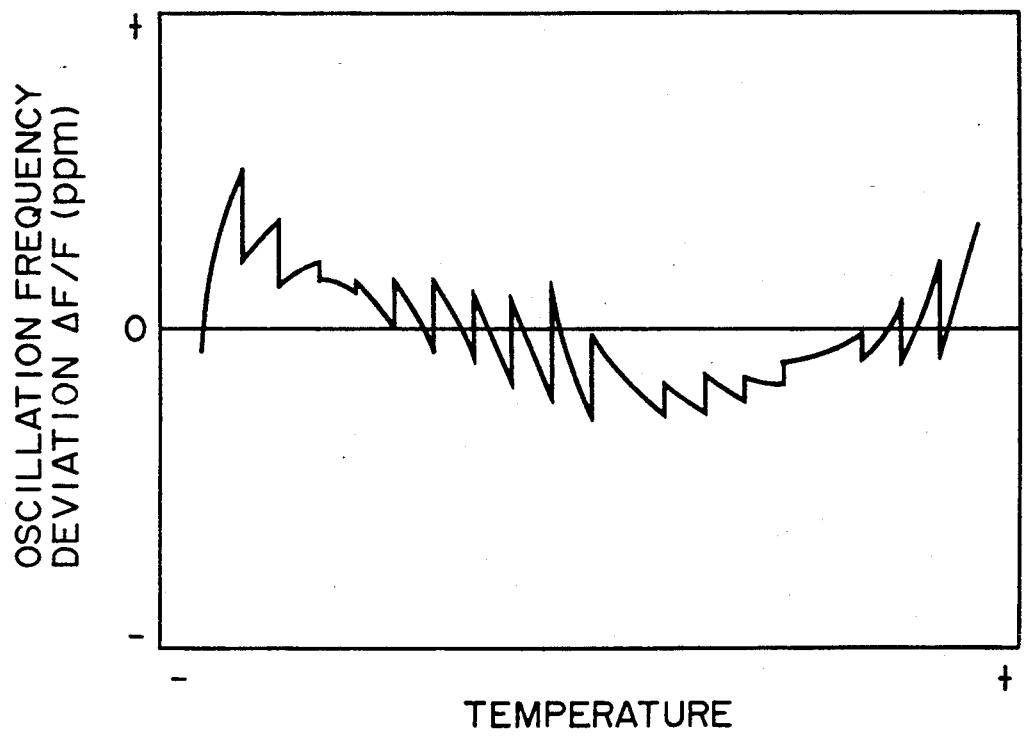
FIG. 2 is a graph showing the relationship between oscillation frequency and ambient temperature in the conventional digital temperature compensation oscillator.
Figure 10:
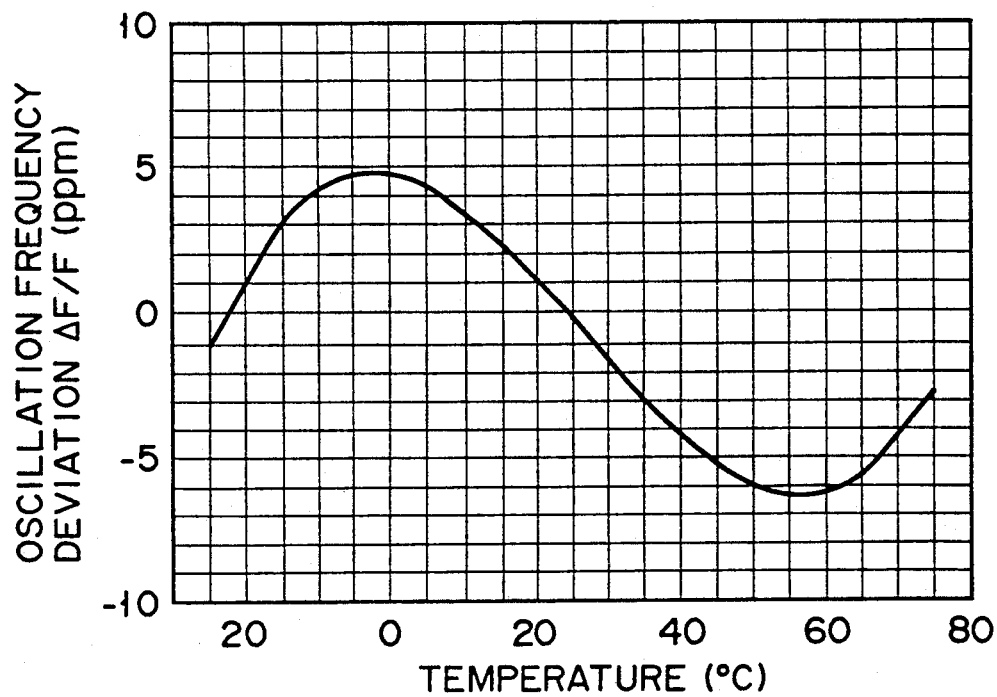
FIG. 10 is a graph showing a frequency/temperature characteristic in the case where temperature compensation is not performed in a voltage controlled crystal oscillator.

The sawtooth-like discontinuity shown in FIG. 2 in the case where interpolation was not carried out can be fully suppressed by the secondary interpolation. For the purpose of reference, FIG. 10 shows a frequency/temperature characteristic obtained when the voltage controlled oscillator was not subjected to temperature compensation.

The above description has been directed to the case where compensation data were converted into second-stage difference format (N=2). Even if N is set to 3 or more and a higher-order difference data format (e.g. three-stage or four-stage) is used, substantially the same construction as that in the case where N=2 can be employed. The same can be said of the interpolation; a third or higher order interpolation can be carried out on the basis of difference data obtained when N=3 or more, in substantially the same manner as the second order interpolation. "Chapter 5, Interpolation" in "Numerical Mathematics" by Günther Hämmerlin and karl-Heinz Hoffmann is incorporated in this specification as a reference.

In the above example, difference data were obtained such that the first difference data $B_1$, $B_2$, . . . $B_n$ and second difference data $C_2$, $C_3$, . . . $C_n$ were obtained, with the top value $A_0$ of 0th difference data employed as a reference value; however, an i-th value (i=a given number) of 0th difference data can be employed as a reference value (initial value). In this case, data corresponding to the reference value or the i-th value of the 0th difference data is employed as first difference data.

Needless to say, a suitable constant value is added to difference data or the difference data is multiplied by a suitable coefficient, thereby enhancing the efficiency of the memory capacity.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A digital temperature compensation oscillator for digitally compensating a variation in oscillation frequency due to temperatures, by applying a compensation voltage to a voltage controlled oscillator, said compensation oscillator comprising:

temperature detection means for detecting temperatures when the voltage controlled oscillator is operated, and generating a temperature signal;

A/D conversion means for receiving the temperature signal, digitizing the temperature signal, and generating digital temperature data;

memory means for storing compensation data corresponding to the compensation voltage as difference data at corresponding addresses, said difference data including, when N-stage level difference data (N=a positive integer) are utilized, predetermined reference values of 0th difference data to (N-1)-th difference data of said compensation data and all N-th data;

operation means for receiving the digital temperature data and the difference data, and generating the compensation data on the basis of the difference data in response to the digital temperature data;

D/A conversion means for receiving the compensation data, and converting the compensation data into an analog compensation voltage; and said voltage controlled oscillator including means for generating a compensated oscillation frequency in response to the analog compensation voltage.

2. The digital temperature compensation oscillator according to claim 1, wherein said operation means includes:

interpolation means for obtaining said compensation data by effecting interpolation by approximation based on an Nth or lower polynomial expression, on the basis of initial values of the 0th difference data to (N-1)th difference data and all values of Nth difference data of said difference data, in the case where an address corresponding to said digital temperature data has an intermediate value between adjacent addresses in said memory means.

3. The digital temperature compensation oscillator according to claim 1, wherein said predetermined reference values are an n-th data (n=a given number) of the 0th difference data and the corresponding first difference data.

4. The digital temperature compensation oscillator according to claim 3, wherein said predetermined reference values are initial values of the 0th difference data and the first difference data.

5. The digital temperature compensation oscillator according to claim 1, wherein said predetermined reference values are values obtained by adding a predetermined value to the initial values of the 0th difference data and the first difference data.

6. The digital temperature compensation oscillator according to claim 1, wherein said predetermined reference values are values obtained by multiplying the initial values of the 0th difference data and the first difference data by a predetermined factor.

* * * * *